United States Patent
Yamada et al.

(10) Patent No.: US 10,067,387 B2
(45) Date of Patent: Sep. 4, 2018

(54) IMAGE DISPLAY DEVICE

(71) Applicant: FUJIFILM Corporation, Tokyo (JP)

(72) Inventors: Naoyoshi Yamada, Fujinomiya (JP);
Ryuta Takegami, Fujinomiya (JP)

(73) Assignee: FUJIFILM Corporation, Tokyo (JP)

( * ) Notice: Subject to any disclaimer, the term of this patent is extended or adjusted under 35 U.S.C. 154(b) by 18 days.

(21) Appl. No.: 15/191,978

(22) Filed: Jun. 24, 2016

(65) Prior Publication Data

US 2016/0306230 A1  Oct. 20, 2016

Related U.S. Application Data

(63) Continuation of application No. PCT/JP2015/050002, filed on Jan. 5, 2015.

(30) Foreign Application Priority Data

Jan. 9, 2014 (JP) ................. 2014-002171

(51) Int. Cl.
*G02F 1/13363* (2006.01)
*G02B 5/30* (2006.01)
(Continued)

(52) U.S. Cl.
CPC ..... *G02F 1/133634* (2013.01); *G02B 5/3083* (2013.01); *G02F 1/13338* (2013.01);
(Continued)

(58) Field of Classification Search
CPC ......... G02F 1/133634; G02F 1/133603; G02F 1/13338; G02F 1/133528;
(Continued)

(56) References Cited

U.S. PATENT DOCUMENTS

| 2006/0176425 | A1* | 8/2006 | Ito ........................ | G02B 5/3008 349/96 |
| 2007/0048461 | A1* | 3/2007 | Nakajima ............... | B32B 23/08 428/1.31 |

(Continued)

FOREIGN PATENT DOCUMENTS

| JP | 2011059488 A | * | 3/2011 |
| JP | 4888853 B2 | | 2/2012 |
| JP | 2012-256014 A | | 12/2012 |
| WO | 2014/208309 A1 | | 12/2014 |

OTHER PUBLICATIONS

English translation of JP 2011059488 A, Title: Polarizing Plate and Liquid Crystal Display Device, Author: Akematsu Yoshimi; Ri Arei; Kin Hoshun; Date of publication: Mar. 24, 2011.*

(Continued)

*Primary Examiner* — Edward Glick
*Assistant Examiner* — Shan Liu
(74) *Attorney, Agent, or Firm* — Sughrue Mion, PLLC

(57) ABSTRACT

An image display device including a polarizer and a first optical film, in which the first optical film is arranged on a visible side from the polarizer, the first optical film has Re(589) of 3,000 nm to 30,000 nm and Rth(589) of −30,000 nm to −3,000 nm, an angle $\theta_1$ between a slow axis of the first optical film and an absorption axis of the polarizer is 45°±30°, and the image display device is a liquid crystal display device including a blue or ultraviolet LED, a fluorescent body, and a liquid crystal cell, or an organic EL display device, is able to suppress the occurrence of rainbow unevenness without darkening brightness at the time of being observed by mounting polarized sunglasses, and is able to suppress the occurrence of the rainbow unevenness without darkening the brightness at the time of being observed by mounting the polarized sunglasses even in a case where a film which has great optical anisotropy and is stretched in at least a monoaxial direction is further provided on the visible side of the image display device.

17 Claims, 2 Drawing Sheets

(51) Int. Cl.
*H01L 51/52* (2006.01)
*G02F 1/1333* (2006.01)
*G02F 1/1335* (2006.01)
*H01L 27/32* (2006.01)
*G06F 3/041* (2006.01)

(52) U.S. Cl.
CPC .. *G02F 1/133528* (2013.01); *G02F 1/133603* (2013.01); *H01L 27/323* (2013.01); *H01L 51/524* (2013.01); *H01L 51/5281* (2013.01); *H01L 51/5284* (2013.01); *G02B 2207/121* (2013.01); *G02F 2001/133541* (2013.01); *G02F 2001/133562* (2013.01); *G02F 2001/133614* (2013.01); *G02F 2001/133635* (2013.01); *G02F 2413/01* (2013.01); *G02F 2413/02* (2013.01); *G02F 2413/08* (2013.01); *G06F 3/0412* (2013.01); *H01L 2251/558* (2013.01)

(58) Field of Classification Search
CPC ..... G02F 2001/133614; G02F 2413/02; G02F 2001/133562; G02F 2001/133541; G02F 2413/01; G02F 2413/08; G02F 2001/133635; G02F 1/0311; G02F 1/116; G02F 1/1335; G02F 1/133536; G02F 1/13362; G02F 1/133533; G02F 2001/133531; G02F 2001/133521; G02F 2001/13356; G02F 2001/133538; G02F 2001/133543; G02F 2001/133545; G02F 2001/133548; G02F 2001/13355; G02F 2001/133567; G02F 2203/16; G02B 5/3083; G02B 2207/121; G02B 5/3033; G02B 6/0056; G02B 6/02109; H01L 51/5281; H01L 51/5284; H01L 27/323; H01L 51/524; H01L 2251/558; H01L 51/5293; G06F 3/0412; B29D 11/00644; B32B 17/10458; B32B 2307/42; H01R 12/7005; H04B 10/532; G01J 5/0825; G03F 9/7065; G01R 33/3678; C09K 19/0208

USPC .......................................... 349/96–103, 194
See application file for complete search history.

(56) References Cited

U.S. PATENT DOCUMENTS

| | | | |
|---|---|---|---|
| 2008/0068545 A1* | 3/2008 | Doi | B32B 27/36 349/118 |
| 2009/0316095 A1* | 12/2009 | Do | G02F 1/13363 349/118 |
| 2011/0177289 A1* | 7/2011 | Takegami | B29C 47/065 428/141 |
| 2012/0162763 A1* | 6/2012 | Son | G02B 27/2214 359/463 |
| 2012/0229732 A1* | 9/2012 | Koike | G02F 1/13363 349/69 |
| 2012/0250142 A1* | 10/2012 | Kobuchi | G02F 1/00 359/321 |
| 2013/0093982 A1* | 4/2013 | Kuroda | G02F 1/133528 349/69 |
| 2013/0100378 A1* | 4/2013 | Murata | G02F 1/133528 349/61 |
| 2013/0194211 A1* | 8/2013 | Shinohara | G02B 1/115 345/173 |
| 2015/0362647 A1* | 12/2015 | Tanimoto | G02F 1/13363 428/413 |
| 2016/0109632 A1 | 4/2016 | Takegami et al. | |

OTHER PUBLICATIONS

International Preliminary Report on Patentability issued from the International Bureau in counterpart Application No. PCT/JP2015/050002, dated Jul. 21, 2016.
Translation of International Search Report and Written Opinion, issued by International Searching Authority in corresponding International Application No. PCT/JP2015/050002 dated Mar. 17, 2015, submitted Jun. 24, 2016.
International Search Report for PCT/JP2015/050002 dated Mar. 17, 2015.
Written Opinion for PCT/JP2015/050002 dated Mar. 17, 2015.

* cited by examiner

IMAGE DISPLAY DEVICE

CROSS-REFERENCE TO RELATED APPLICATIONS

This application is a Continuation of PCT International Application No. PCT/JP2015/050002 filed on Jan. 5, 2015, which claims priority under 35 U.S.C. Section 119(a) to Japanese Patent Application No. 2014-002171 filed on Jan. 9, 2014. Each of the above applications is hereby expressly incorporated by reference, in its entirety, into the present application.

BACKGROUND OF THE INVENTION

1. Field of the Invention

The present invention relates to an image display device. More specifically, the present invention relates to an image display device including a polarizer and an optical film.

2. Description of the Related Art

Recently, the application of an image display device such as a liquid crystal display (LCD) or an organic electro luminescence (EL) display device has expanded, and the image display device has been used in a television, a monitor, a smart phone, a car navigation, a digital camera, digital signage, and the like.

In general, LCD includes a polarizing plate on both of a visible side and a light source side of a liquid crystal panel. In addition, an organic EL display device including a polarizing plate on a visible side of an organic EL panel has been made into a product in order to suppress reflection of external light.

In such an image display device including the polarizing plate, the exiting light becomes linearly polarized light, and thus, in a case where the image display device is observed by mounting polarized sunglasses, display darkens, and visibility may considerably deteriorate.

Therefore, in JP4888853B and JP2012-256014A, it has been proposed that excellent visibility is able to be obtained by using a polyester film having great optical anisotropy in a display device or the like even in a case where polarized sunglasses are used.

For example, in JP4888853B, a polyester film having retardation (Re) in an in-plane direction of 3,000 nm to 30,000 nm is disclosed. In addition, in JP2012-256014A, polyester film having retardation (Re) in an in-plane direction of 3,000 nm to 30,000 nm is disclosed in which Re/Rth≥0.2. Furthermore, retardation (Rth) in a thickness direction of these polyester films has a positive value.

On the other hand, it has been known that in a case where a film which has retardation in an in-plane direction of greater than or equal to a hundred nm and great optical anisotropy, such as a biaxially stretched polyester film, is used as a polarizer protective film, rainbow-like color unevenness (rainbow unevenness) occurs at the time of being observed by mounting polarized sunglasses, and visibility deteriorates. Light which exits from the image display device and is transmitted through a polarizer becomes linearly polarized light, but in a case where the polarizer protective film has large Re, the light exiting from the image display device has various phase variations at each wavelength by retardation of the polarizer protective film. In a case where the light exiting from the image display device is observed by mounting polarized sunglasses, different transmittance is obtained at each wavelength, and thus, the light is observed as being colored, and this causes rainbow unevenness. Further, even in a case where the polarized sunglasses are not mounted, the rainbow unevenness may be visible due to polarization dependency of reflectivity of the outermost surface of the polarizer protective film.

However, in the image display device disclosed in JP4888853B and JP2012-256014A, a light source has a continuous light emitting spectrum as with a white LED, and Re of the polarizer protective film is a sufficiently large value, and thus, even in a case where the transmittance is different at each wavelength at the time of observing the light exiting from the image display device by mounting polarized sunglasses, light having various wavelengths of a red color, a green color, and a blue color configuring a white color is transmitted, and thus, the light is entirely observed as white. That is, the rainbow unevenness is not visible. Furthermore, in a case where the image display device which includes an optical film having large Re is observed not only from a front surface but also from an oblique direction, retardation of the optical film on appearance may decrease compared to a case where the image display device is observed from the front surface, and at this time, the size of Re may become insufficient and the rainbow unevenness may be visible, but in JP4888853B and JP2012-256014A, even in a case where the image display device is observed from the oblique direction, an effective range of Re and Rth of the optical film is defined such that the optical film has large Re on appearance.

SUMMARY OF THE INVENTION

Recently, bonding a surface protective film which is configured of a film having great optical anisotropy, such as a biaxially stretched polyester film, onto on the surface of the image display device such as a smart phone or a car navigation system by an end user in order to prevent fingerprint adhesion, glass scattering, or the like has increased. In addition, in a case of an image display device including a touch panel, using a biaxially stretched polyester film or the like as a substrate of an electrode film for a touch panel substrate has increased. In general, such a biaxially stretched film has Re of greater than or equal to hundreds of nm and Rth of greater than or equal to hundreds to tens of thousands of nm, and has an arbitrary azimuth in which the azimuth of a slow axis is not defined.

In consideration of such circumstances, the present inventors have conducted studies with respect to an image display device in which a second film including a film which is stretched in at least a monoaxial direction is arranged on a visible side as described above, and thus, have found that even in a case where the polyester film having large Re which is disclosed in JP4888853B and JP2012-256014A is used as a polarizer protective film, brightness darkens or rainbow unevenness is visible at the time of observing the image display device by mounting polarized sunglasses.

An object of the present invention is to provide an image display device in which the occurrence of rainbow unevenness is able to be suppressed without darkening brightness at the time of being observed by mounting polarized sunglasses, and even in a case where a film which has great optical anisotropy and is stretched in at least a monoaxial direction is further provided on the visible side of the image display device, the occurrence of the rainbow unevenness is able to be suppressed without darkening the brightness at the time of being observed by mounting the polarized sunglasses.

As a result of intensive studies of the present inventors in order to attain the object described above, it has been found that in a case where a biaxially stretched film is bonded to an image display device which includes an optical film including an optical film having large Re which is disclosed in JP4888853B and JP2012-256014A, retardation of the optical film on appearance and retardation of the biaxially stretched film on appearance cancel out each other according to a direction from which observation is performed, and thus, rainbow unevenness is visible.

Therefore, as a result of more intensive studies of the present inventors, an image display device of the present invention having the following configurations has been completed. In the image display device of the present invention, an optical film (hereinafter, referred to as a first optical film) which is arranged on a visible side from a polarizer has large positive Re in a specific range and negative Rth in a specific range, and an angle between an absorption axis of the polarizer and a slow axis of the first optical film is set to be in a specific range, and thus, even when a film which has great optical anisotropy and is stretched in at least a monoaxial direction is provided on the more visible side from the first optical film, retardation of the first optical film on appearance and retardation of a second film on appearance do not cancel out each other or the degree of cancellation decreases at the time of observing the image display device from an oblique direction, and therefore, brightness is obtained since a quenching position at the time of changing an observation direction does not exist, and the occurrence of rainbow unevenness is able to be effectively suppressed.

[1] An image display device, comprising at least a polarizer; and a first optical film, in which the first optical film is arranged on a visible side from the polarizer, in-plane retardation Re(589) of the first optical film at a wavelength of 589 nm satisfies 3,000 nm≤Re(589)≤30,000 nm, retardation Rth(589) of the first optical film in a thickness direction at a wavelength of 589 nm satisfies −30,000 nm≤Rth(589) ≤−3,000 nm, an angle $\theta_1$ between a slow axis of the first optical film and an absorption axis of the polarizer is $\theta_1=45°±30°$, and the image display device is a liquid crystal display device including a blue light emitting diode or an ultraviolet light emitting diode, a fluorescent body enabling light to be emitted by being excited by light from the blue light emitting diode or the ultraviolet light emitting diode, and a liquid crystal cell, or an organic EL display device.

[2] In the image display device according to [1], it is preferable that the liquid crystal display device is a liquid crystal display device which includes a white LED including a blue light emitting diode or an ultraviolet light emitting diode, and a fluorescent body enabling at least yellow light to be emitted by being excited by light from the blue light emitting diode or the ultraviolet light emitting diode as a light source, or a liquid crystal display device which includes the blue light emitting diode or the ultraviolet light emitting diode as a light source, and the fluorescent body arranged between the light source and the liquid crystal cell.

[3] It is preferable that the image display device according to [1] or [2] further comprises a second film including a film which is stretched in at least a monoaxial direction, and the second film is arranged on the visible side from the first optical film.

[4] In the image display device according to [3], it is preferable that the second film includes a biaxially stretched film.

[5] In the image display device according to [3] or [4], it is preferable that the second film includes a conductive layer on at least one surface.

[6] In the image display device according to any one of [3] to [5], it is preferable that a thickness of the second film is 10 μm to 500 μm.

[7] In the image display device according to any one of [3] to [6], it is preferable that retardation Rth(589) of the second film in the thickness direction at a wavelength of 589 nm satisfies 0 nm≤Rth(589).

[8] It is preferable that the image display device according to any one of [1] to [7] further comprises cover glass or a touch panel substrate on the visible side from the first optical film.

[9] In the image display device according to [8], it is preferable that the touch panel substrate includes the second film.

[10] In the image display device according to [9], it is preferable that the image display device includes the cover glass and the touch panel, substrate, and the cover glass, the second film, and the first optical film are arranged in this order from the visible side.

[11] In the image display device according to any one of [1] to [10], it is preferable that the first optical film includes a hardcoat layer.

[12] In the image display device according to any one of [1] to [11], it is preferable that the first optical film contains an ultraviolet absorbent.

[13] In the image display device according to any one of [1] to [12], it is preferable that the first optical film includes a conductive layer on at least one surface.

[14] In the image display device according to any one of [1] to [13], it is preferable that a thickness of the first optical film is 10 μm to 500 μm.

[15] In the image display device according to any one of [1] to [14], it is preferable that the first optical film contains a polystyrene-based resin.

[16] In the image display device according to [15], it is preferable that the polystyrene-based resin includes a crystalline polystyrene-based resin.

[17] In the image display device according to [15] or [16], it is preferable that the polystyrene-based resin has a syndiotactic structure.

According to the present invention, it is possible to provide an image display device in which the occurrence of rainbow unevenness is able to be suppressed without darkening brightness at the time of being observed by mounting polarized sunglasses, and even in a case where a film which has great optical anisotropy and is stretched in at least a monomial direction is further provided on the visible side of the image display device, the occurrence of the rainbow unevenness is able to be suppressed without darkening the brightness at the time of being observed by mounting the polarized sunglasses.

DESCRIPTION OF THE PREFERRED EMBODIMENTS

Figure 1:
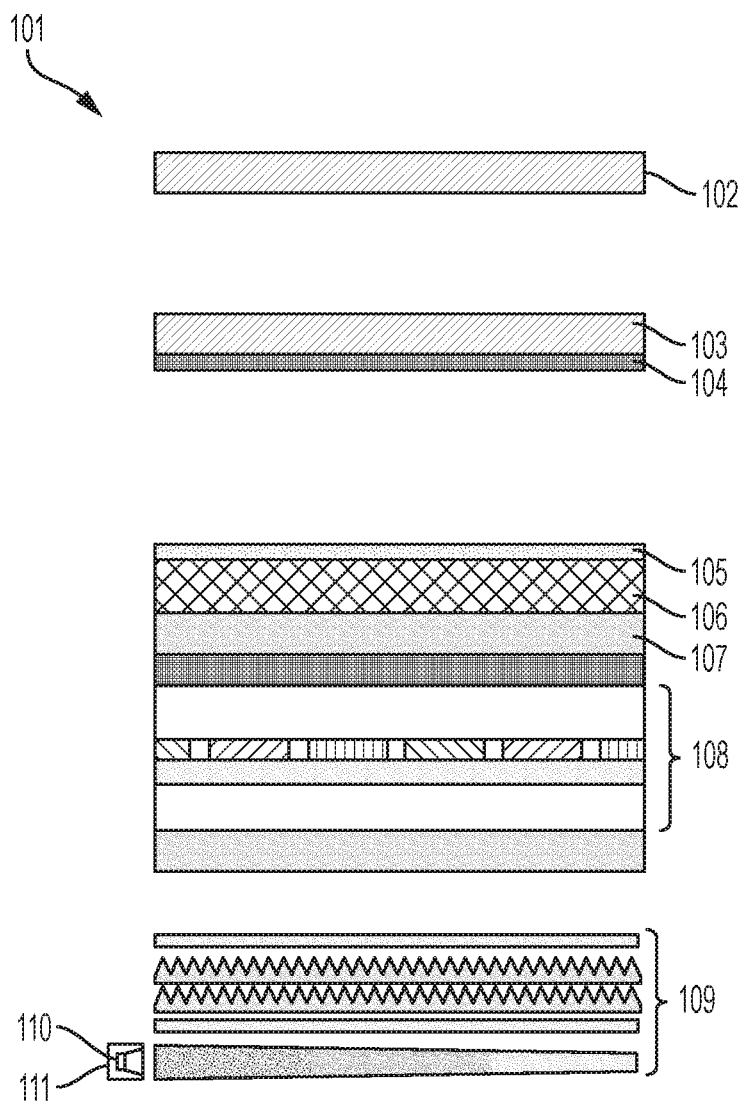
FIG. 1 is an illustration of a liquid crystal display device embodying the invention.

Hereinafter, the present invention will be described in detail. The following description of configuration requirement is based on a representative embodiment or a specific example, but the present invention is not limited to such an embodiment. Furthermore, herein, a numerical range denoted by using to indicates a range including numerical values described before and after to as a lower limit value and an upper limit value. Herein, various angles may include an optically allowable error, and for example, may include an error of ±5°, preferably ±3°, and more preferably ±1°.

[Image Display Device]

An image display device of the present invention is an image display device including at least a polarizer and a first optical film, the first optical film is arranged on a visible side from the polarizer, in-plane retardation Re(589) of the first optical film at a wavelength of 589 nm satisfies 3,000 nm≤Re(589)≤30,000 nm, retardation Rth(589) of the first optical film in a thickness direction at a wavelength of 589 nm satisfies −30,000 nm≤Rth(589)≤3,000 nm, an angle $\theta_1$ between a slow axis of the first optical film and an absorption axis of the polarizer is $\theta_1=45°±30°$, and the image display device is a liquid, crystal display device including a blue light emitting diode or an ultraviolet light, emitting diode, a fluorescent body enabling light to be emitted by being excited by light from the blue light emitting diode or the ultraviolet light emitting diode, and a liquid crystal cell, or an organic EL display device.

According to such a configuration, in the image display device of the present invention, the occurrence of rainbow unevenness is able to be suppressed without darkening brightness at the time of being observed by mounting polarized sunglasses, and even in a case where a film which has great optical anisotropy and is stretched in at least a monoaxial direction is further provided on the visible side of the image display device (for example, a case where a surface protective film configured of a biaxially stretched film having great optical anisotropy, such as a biaxially stretched polyester film is bonded or a case where a touch panel including a film which has great optical anisotropy and is stretched in at least a monoaxial direction is arranged), the occurrence of the rainbow unevenness is able to be suppressed without darkening the brightness at the time of being observed by mounting the polarized sunglasses.

For example, biaxially stretched polyethylene terephthalate hereinafter, also referred to as PET) which is generally used as a substrate of a scattering prevention film has problems in that Re and Rth are large, and a slow axis thereof is directed towards an arbitrary direction. In general, in the film which is used for the application described above, has great optical anisotropy, and is stretched in at least a monoaxial direction, such as a biaxially stretched polyester film, in-plane retardation Re(589) at a wavelength of 589 nm is in a range of 100 nm to 30,000 nm, and retardation Rth(589) in a thickness direction at a wavelength of 589 nm is in a range of 100 nm to 30,000 nm.

In contrast, the present inventors have found that in a case where a film having large Re and negative Rth is used, and the azimuth of a slow axis of the film is arranged to be 45°±30° with respect to the absorption axis of the polarizer, rainbow unevenness is not exhibited even in a case of being combined with the biaxially stretched PET or the like. The image display device including a white fight source or the like in which the film which has high Re and high negative Rth and is arranged on the visible side from the polarizer and the polarizer are arranged such that the angle $\theta_1$ between the slow axis of the film and the absorption axis of the polarizer is 45°±30°, a quenching position at the time of changing an observation direction does not exist (bright at all times), and rainbow unevenness is able to be reduced, and even in a case where the film which has great optical anisotropy, is stretched in at least a monoaxial direction, and causes rainbow unevenness, such as the biaxially stretched PET, is laminated on the visible side, the quenching position at the time of changing the observation direction does not exist, and the rainbow unevenness is able to be reduced.

<First Optical Film>

In the first optical film described above, the first optical film is arranged on the visible side from the polarizer, the in-plane retardation Re(589) of the first optical film at a wavelength of 589 nm satisfies 3,000 nm≤Re(589)≤30,000 nm, the retardation Rth(589) of the first optical film in the thickness direction at a wavelength of 589 nm satisfies −30,000 nm≤Rth(589)≤−3,000 nm, and the angle $\theta_1$ between the slow axis of the first optical film and the absorption axis of the polarizer is $\theta_1=45°±30°$.

First, preferred embodiments of the first optical film will be described.

(Properties)

The in-plane retardation Re(589) of the first optical film at a wavelength of 589 nm is in a range of 3,000 nm to 30,000 nm, is preferably in a range of 7,000 nm to 30,000 nm, and is more preferably in a range of 8,000 nm to 30,000 nm.

By setting Re(589) to be in the range described above, it is possible to suppress the occurrence of the rainbow unevenness at the time of incorporating the first optical film into the image display device. Furthermore, Re(589) of the first optical film for suppressing the occurrence of the rainbow unevenness does not have an upper limit, but in general, it is necessary to increase the thickness of the first optical film in order to set Re(589) to be in a range of greater than 30,000 nm, and it is preferable that Re(589) is less than or equal to 30,000 nm from the viewpoint of the recent trend of thinning the image display device.

In addition, the retardation Rth(589) of the first optical film in the thickness direction at a wavelength of 589 nm is −30,000 nm to −3,000 nm, is preferably −30,000 nm to −8,000 nm, and is more preferably −30,000 nm to −9,000 nm. By setting Rth(589) to be in the range described above, in a case where the film which has great optical anisotropy and is stretched in at least a monoaxial direction is included in the image display device into which the first optical film is incorporated, for example, the retardation of the first optical film on appearance and the retardation of a second film on appearance do not cancel out each other or the degree of cancellation decreases at the time of observing the image display device from an oblique direction, and the occurrence of rainbow unevenness is able to be effectively suppressed even in a case of bonding a surface protective film configured of a film which has positive Rth and great optical anisotropy, such as a biaxially stretched polyester film or a case of using a touch panel in which a biaxially stretched polyester film or the like is used as a substrate of an electrode film in order to prevent fingerprint adhesion, glass scattering, or the like, and therefore, brightness is obtained since the quenching position at the time of changing the observation direction does not exist.

Here, the retardation (Re) of the first optical film in an in-plane direction is defined by Expression (1) described below, and the retardation (Rth) in the thickness direction is defined by Expression (2) described below.

$$Re=(nx-ny)\times d \tag{1}$$

$$Rth=\{(nx+ny)/2-nz\}\times d \tag{2}$$

In Expressions (1) and (2), nx represents the refractive index of the first optical film in an in-plane slow axis direction, ny represents the refractive index of the first optical film in an in-plane fast axis direction, nz represents the refractive index of the first optical film in the thickness direction, and d represents the thickness of the first optical film. The refractive indices nx, ny, and nz of the first optical film are able to be measured by using "ABBE'S REFRACTOMETER NAR-4T" manufactured by Atago Co., Ltd. and a sodium lamp.

The angle $\theta_1$ between the slow axis of the first optical film and the absorption axis of the polarizer is 45°±30°, is more preferably 45°±15°, and is even more preferably 45°±5°. Light transmitted through the polarizer becomes linearly polarized light, but in a case where $\theta_1$ is set to be in the range described above, the light is converted into elliptically polarized light having various ellipticities at each wavelength, and thus, it is possible to make display more bright at the time of observing the image display device by mounting polarized sunglasses.

It is preferable that the film thickness of the first optical film is 10 μm to 500 μm. The film thickness of the first optical film is more preferably 15 μm to 400 μm, is even more preferably 15 μm to 300 μm, and is still even more preferably 20 μm to 200 μm. In order to decrease the thickness of the image display device, it is preferable that the first optical film is thinned, and it is preferable that the thickness of the first optical film is greater than or equal to 10 μm from the viewpoint of transportability and workability. In addition, in a case where the thickness of the first optical film is greater than or equal to 10 μm, Re of greater than or equal to 3,000 nm or Rth of less than or equal to −3,000 nm is easily exhibited.

(Composition)

Examples of an embodiment of manufacturing a film satisfying optical properties of the first optical film which is used in the image display device of the present invention include an embodiment of manufacturing a film containing a negative birefringence resin described below.

In addition, examples of an embodiment of manufacturing a film satisfying optical properties of the first optical film which is used in the image display device of the present invention further include an embodiment of manufacturing a layer in which a non-liquid crystal polymer organic compound is contained in a film having small birefringence properties, such as a TAC film, in the amount of greater than or equal to 50 mass %, and an embodiment of manufacturing a layer formed by immobilizing homeotropic alignment of a composition which contains a rod-like liquid crystal in the amount of greater than or equal to 50 mass %. Furthermore, a specific example of the non-liquid crystal polymer organic compound or the rod-like liquid crystal can be referred to the description disclosed in JP2013-50482A.

Hereinafter, a film containing a negative birefringence resin will be described.

—Negative Birefringence Resin—

It is preferable that the first optical film contains a resin exhibiting negative birefringence properties at the time of being a film. Hereinafter, the resin exhibiting negative birefringence properties at the time of being a film will be also referred to as a negative birefringence resin. The negative birefringence resin is not particularly limited insofar as these conditions are satisfied, but in a case where the film is manufactured by using a melting and extruding method, it is preferable that a material having excellent moldability of melting and extruding is used, and from this viewpoint, a cyclic olefin-based resin (however, excluding a positive birefringence resin, that is, a resin in which the refractive index of light in an alignment direction is larger than the refractive index of light in a direction orthogonal to the alignment direction when the light is incident on a layer formed by monoaxially aligning molecules), a cellulose acylate-based resin (however, excluding a positive birefringence resin), a maleimide-based resin, a polystyrene-based resin, an acrylic resin, a styrene-based resin such as polystyrenes, a polyacrylonitrile-based resin, and a polyvinyl acetal-based resin are able to be used. In the present invention, among them, it is particularly preferable that the polystyrene-based resin is used, and it is preferable that the first optical film is a polystyrene-based film.

The negative birefringence resin which is used in the present invention may contain one type of resin, or may contain two or more types of resins which are different from each other. In addition, one type of resin independently exhibiting negative birefringence properties may be independently used, and in a case where two or more types of resins are blended with each other and the resins exhibit negative birefringence properties, two or more types of resins may be used in combination. In a case where the negative birefringence resin is polymer blend formed of a resin which is an independently negative birefringence resin and a resin which is an independently positive birefringence resin, a formulating ratio of the resin which is the independently negative birefringence resin to the resin which is the independently positive birefringence resin is different according to the size of the absolute value of the intrinsic birefringence values of both of the resins, exhibiting properties of the birefringence properties at a molding temperature, and the like. In addition, the polymer blend may contain other components other than the resin which is the independently negative birefringence resin and the resin which is the independently positive birefringence resin. The other components are not particularly limited insofar as the effect of the present invention is not impaired, but the other components are able to be suitably selected according to the purpose, and examples of the other components suitably include a compatibilizing agent and the like. The compatibilizing agent is able to be suitably used in a case where phase separation occurs at the time of blending, and it is possible to make a mixed state of the resin which is the independently negative birefringence resin and the resin which is the independently positive birefringence resin excellent by using the compatibilizing agent.

It is more preferable that the negative birefringence resin which is used in the present invention is the polystyrene-based resin. In the present invention, the polystyrene-based resin indicates a resin obtained by polymerizing styrene and a derivative of styrene as a main component and a copolymer resin of styrene and other resins. The polystyrene-based resin which is able to be used in the present invention is not particularly limited insofar as the effect of the present invention is not impaired, and a known polystyrene-based thermoplastic resin and the like are able to be used. In particular, it is preferable that the copolymer resin of styrene and other resins is used in which birefringence, film strength, and heat resistance are able to be improved.

Examples of the copolymer resin include a styrene-acrylonitrile-based resin, a styrene-acrylic resin, a styrene-maleic anhydride-based resin, a multi-component (binary, ternary, and the like) copolymerization polymer thereof, and the like. Among them, the styrene-acrylic resin or the styrene-maleic anhydride-based resin is preferably from the viewpoint of heat resistance and film strength.

In the styrene-maleic anhydride-based resin, a mass compositional ratio of styrene and maleic anhydride is preferably styrene:maleic anhydride=95:5 to 50:50, and is more preferably styrene:maleic anhydride=90:10 to 70:30. In addition, in order to adjust intrinsic birefringence, a resin in which hydrogen is added to a styrene-based resin is able to be preferably used. "Daylark D332" manufactured by Nova Chemicals Corporation and the like are able to be used as the styrene-maleic anhydride-based resin. In addition, "Delpet 980N" described below which is manufactured by Asahi Kasei Chemicals Corporation and the like are able to be used as the styrene-acrylic resin.

The polystyrene-based resin may be a non-crystalline polystyrene-based resin or a crystalline polystyrene-based resin, and it is preferable that at least the crystalline polystyrene-based resin is contained from the viewpoint of mechanical strength. Examples of the crystalline polystyrene-based resin are able to include a polystyrene-based resin having a syndiotactic structure and a polystyrene-based resin having an isotactic structure. Examples of the non-crystalline polystyrene-based resin are able to include a polystyrene-based resin having an atactic structure.

The polystyrene-based resin may have a syndiotactic structure, an isotactic structure, or an atactic structure, and it is preferable that the polystyrene-based resin has a syndiotactic structure. The polystyrene-based resin having a syndiotactic structure is particularly excellent from the viewpoint of high mechanical strength and a small thermal shrinkage rate. The polystyrene-based polymer having a syndiotactic structure which is used in the present invention has a stereoscopic structure where phenyl groups or derivatives thereof which are side chains with respect to a main chain formed of a carbon-carbon bond are positioned in opposite directions, and the stereoregularity (tacticity) thereof is generally quantified by using a nuclear magnetic resonance method (a $^{13}$C-NMR method) of isotopic carbon and has excellent accuracy. In a case where art existence ratio of a plurality of continuous configuration units, for example, is 2, the stereoregularity measured by the $^{13}$C-NMR method is able to be denoted by a dyad, in a case where the existence ratio is 3, the stereoregularity is able to be denoted by a triad, and in a case where the existence ratio is 5, the stereoregularity is able to be denoted by a pentad. The styrene-based polymer having a syndiotactic structure which is used in the present invention has stereoregularity which is generally 75% to 100% in a racemic dyad, and is preferably 85% to 100% in a racemic dyad, or is 30% to 100% in a racemic dyad, and is preferably 50% to 100% in a racemic dyad. Specifically, examples of the styrene-based polymer having a syndiotactic structure include stereoregular polystyrene, poly(alkyl styrene), poly(halogenated styrene), poly(halogenated alkyl styrene), poly(alkoxy styrene), and poly(vinyl benzoic acid ester). Here, examples of the poly(alkyl styrene) include poly(methyl styrene), poly(ethyl styrene), poly(propyl styrene), poly(butyl styrene), poly(phenyl styrene), poly(vinyl naphthalene), poly(vinyl styrene), poly(acenaphthyne), and the like. In addition, examples of the poly(halogenated styrene) include poly(chlorostyrene), poly(bromostyrene), poly(fluorostyrene), and the like. In addition, examples of the poly(alkoxy styrene) include poly(methoxy styrene), poly(ethoxy styrene), and the like. Among them, the poly(styrene) and the poly(methyl styrene) are more preferable, and the poly (styrene) is even more preferable.

These polystyrene-based polymers having a syndiotactic structure may be copolymers other than the homopolymers described above. Examples of a comonomer component of the copolymer are able to include an olefin monomer such as ethylene, propylene, butene, hexene, and octene, a diene monomer such as butadiene and isoprene, a cyclic olefin monomer, a cyclic diene monomer, a polar vinyl monomer such as methyl methacrylate, maleic anhydride, and acrylonitrile, and the like in addition to monomers configuring the styrene-based polymer described above. Among them, a comonomer component is preferable in which alkyl styrene, styrene hydride, and halogenated styrene are copolymerized with styrene as a main component. Among them, p-methyl styrene, m-methyl styrene, p-tertiary butyl styrene, p-chlorostyrene, m-chlorostyrene, p-fluorostyrene, and styrene hydride are preferable, and the p-methyl styrene is particularly preferable.

The added amount of the comonomer components is preferably 0 mass % to 30 mass %, is more preferably 1 mass % to 20 mass %, and is even more preferably 3 mass % to 10 mass %, with respect to the total polymer. According to this copolymerization, a crystallization rate decreases, and the occurrence of a spherocrystal is suppressed. As a result thereof, it is possible to attain a polystyrene-based resin having a syndiotactic structure with high transparency and high folding endurance.

In addition, the syndiotactic-polystyrene-based polymer and other polymer may be used by being blended with each other. A styrene-based polymer having a syndiotactic structure as described, above or a styrene-based polymer having an atactic structure is preferable as a preferred polymer blend component from the viewpoint of compatibility. Among them, in particular, a styrene-based polymer is preferable in which a homopolymer having a syndiotactic structure or an atactic structure formed by containing polystyrene having a syndiotactic structure as a main component, and by containing p-methyl styrene, m-methyl styrene, p-tertiary butyl styrene, p-chlorostyrene, m-chlorostyrene, p-fluorostyrene, styrene hydride, and the like as a constituent, and/or a copolymer having a syndiotactic structure or an atactic structure formed of at least one type of monomer thereof and styrene are blended with each other. In particular, a styrene-based polymer is preferable in which a copolymer of p-methyl styrene having a syndiotactic structure or p-methyl styrene having a syndiotactic structure and styrene is blended with polystyrene having a syndiotactic structure. The added amount of the polymers to be blended is preferably 0 mass % to 30 mass %, is more preferably 1 mass % to 20 mass %, and is even more preferably 3 mass % to 10 mass %, with respect to the total amount of the polymers.

In the molecular weight of the syndiotactic-polystyrene-based polymer used in the present invention, weight average molecular weight is preferably 100,000 to 800,000, and is particularly preferably 200,000 to 600,000. Further, in a molecular weight distribution, weight average molecular weight (Mw)/number average molecular weight (Mn) is preferably 1.5 to 5, and is more preferably 2 to 4. Such a syndiotactic-polystyrene-based polymer, for example, is able to be manufactured by polymerizing a styrene-based monomer (a monomer corresponding to the constituent of the styrene-based polymer described above) in an inactive hydrocarbon solvent or in the absence of a solvent by using a condensation product of a titanium compound, water, and trialkyl aluminum as a catalyst (JP1987-187708A (JP62-187708A)). Alternatively, the syndiotactic-polystyrene-based polymer is able to be manufactured by performing polymerization by using a compound formed of a titanium compound, a cation, and an anion in which a plurality of groups are bonded to an element as a catalyst (JP1992-249504A (JP-H04-249504A)).

Examples of a commercially available product of syndiotactic polystyrene include XAREC S105 (manufactured by Idemitsu Kosan Co., Ltd.).

Examples of a commercially available product of atactic polystyrene include HF77 (manufactured by PS Japan Corporation).

—Additive—

The first optical film may contain materials in addition to the negative birefringence resins described above. Examples of the materials other than the resins include various additives such as a stabilizer, an ultraviolet absorbent, a light stabilizer, a plasticizer, fine particles, and an optical adjusting agent. Furthermore, specific examples of the additives can be referred to the description disclosed in paragraphs [0054] to [0065] of JP2010-137422A, and the contents of the publication are incorporated in the present invention.

In particular, it is preferable that the first optical film described above contains at least one of a stabilizer or an ultraviolet absorbent as an additive, and it is preferable that the first optical film contains both of the stabilizer and the ultraviolet absorbent.

It is preferable that the first optical film described above contains the stabilizer from the viewpoint of durability of a film.

A phenol-based stabilizer is preferable as the stabilizer, and a hindered phenol-based stabilizer is more preferable.

In the present invention, for example, Irganox1010 (manufactured by BASF SE) is able to be preferably used as the stabilizer. The stabilizers are able to be each independently used or two or more types thereof are able to be used in combination, a formulating ratio thereof is suitably selected in a range of not impairing the object of the present invention. The added amount of the stabilizer is preferably 0.001 mass % to 5 mass %, is more preferably 0.005 mass % to 3 mass %, and is even more preferably 0.01 mass % to 0.8 mass %, with respect to the mass of the resin contained in the first optical film.

In a case where the first optical film is exposed to external light including solar light by being used for a long period of time, it is preferable that the first optical film described above contains the ultraviolet absorbent since the deterioration of the first optical film itself, the polarizer, or the like is able to be suppressed.

Any known ultraviolet absorbent which is able to exhibit ultraviolet ray absorption properties is able to be used as the ultraviolet absorbent. For example, a benzotriazole-based ultraviolet absorbent, a hydroxy phenyl triazine-based ultraviolet absorbent, and a benzoxazine-based ultraviolet absorbent are able to be suitably used. In the present invention, for example, 2,2'-(p-phenylene)di-3,1-benzaxazine-4-one (manufactured by FUJIFILM Finechemicals Co., Ltd., Product Name: UVSORB 101) is able to be preferably used as the ultraviolet absorbent. In addition, in order to widen the absorption width of an ultraviolet ray, two or more types of ultraviolet absorbents having different maximum absorption wavelengths may be used in combination. The added amount of the ultraviolet absorbent is preferably 0.01 mass % to 2 mass %, and is more preferably 0.01 mass % to 1.5 mass %, with respect to the resin, contained in the first optical film.

(Configuration)

The first optical film is arranged on the visible side from the polarizer.

The first optical film may be bonded to other members such as a polarizer, a polarizer protective film, a cover glass, a touch panel substrate, and an arbitrary member included in the touch panel substrate by an adhesive agent, a pressure sensitive adhesive material, or the like, and the first optical film may be arranged with the other member described above through an air layer. In addition, the polarizer protective film may be a polarizer protective film which is subjected to roll-to-roll molding and is integrated with the polarizer.

It is preferable that the first optical film described above is bonded to the other member by the adhesive agent, the pressure sensitive adhesive material, or the like, and it is more preferable that the first optical film is bonded to the polarizer protective film on the most visible side which is included in the polarizing plate of the image display device on the visible side by the adhesive agent, the pressure sensitive adhesive material, or the like and is incorporated in a part of the polarizer protective film or the first optical film is bonded to a transparent conductive layer by the adhesive agent, the pressure sensitive adhesive material, and the like in the touch panel substrate, and it is particularly preferable that the first optical film is bonded to the polarizer protective film on the most visible side which is included in the polarizing plate of the image display device on the visible side by the adhesive agent, the pressure sensitive adhesive material, or the like and is incorporated in apart of the polarizer protective film.

—Easily Adhesive Layer—

It is preferable that the first optical film includes an easily adhesive layer in order to allow the first optical film to adhere to the other member. For example, in order to improve adhesiveness with respect to the polarizer, it is possible to dispose a polarizer side easily adhesive layer on the surface of the first optical film to which the polarizer is bonded. In addition, in order to improve adhesiveness with respect to a hardcoat layer, it is possible to dispose a hardcoat side easily adhesive layer on the surface of the first optical film onto which hardcoat is applied.

The film thickness of the easily adhesive layer of the first optical film in the present invention is generally in a range of 0.002 μm to 1.0 μm, is more preferably in a range of 0.03 μm to 0.5 μm, and is even more preferably in a range of 0.04 μm to 0.2 μm. In a case where the film thickness is less than 0.002 μm, there is a possibility that sufficient adhesiveness is not able to be obtained, and in a case where the film thickness is greater than 1.0 μm, there is a possibility that appearance or transparency, and blocking properties of a film deteriorate.

In the present invention, a known coating method of the related art such as reverse gravure coating, direct gravure coating, roll coating, die coating, bar coating, and curtain coating, is able to be used as a method of disposing the easily adhesive layer on the first optical film. Examples of a coating method are disclosed in "Coating Method" written by Yuji HARASAKI and published in 1979 by Meirinkan Shoten.

In the present invention, drying and curing conditions at the time of forming the easily adhesive layer on the first optical film are not particularly limited, and for example, in a case where the easily adhesive layer is disposed by off-line coating, in general, a heat treatment may be performed on the basis of conditions of a temperature of 80° C. to 200° C. for 3 seconds to 40 seconds, and preferably conditions of a temperature of 100° C. for 180° C. for 3 seconds to 40 seconds.

On the other hand, in a case where the easily adhesive layer is disposed by in-line coating, in general, the heat treatment may be performed on the basis of conditions of a temperature of 70° C. to 280° C. for 3 seconds to 200 seconds.

In addition, as necessary, the heat treatment may be used along with active energy ray irradiation such as ultraviolet ray irradiation regardless of the off-line coating or the in-line coating. The first optical film of the present invention may be subjected to a surface treatment such as a corona treatment and a plasma treatment in advance.

—Bonding with Respect to Polarizer—

In a case where the first optical film is used as a protective film of the polarizer of the polarizing plate, in general, it is preferable that the first optical film is bonded to the polarizer through an adhesive agent in order to allow the polarizer to adhere to the polarizer side easily adhesive layer side.

A known adhesive agent of the related art is able to be used as the adhesive agent, and examples of the adhesive agent include an acrylic compound such as polyvinyl alcohol, polyvinyl butyral, and polybutyl acrylate, an epoxy-based compound having an aliphatic epoxy group which is exemplified as a glycidyl group, epoxy cyclohexane, and the like.

It is preferable that, for example, polyvinyl alcohol which is monoaxially stretched and is dyed with iodine or the like is bonded onto the manufactured adhesive layer as the polarizer. It is possible to bond a protective film, a retardation film, or the like onto art opposite side of the polarizer and to make a polarizing plate.

—Conductive Layer—

The first optical film may be a transparent conductive film including a conductive layer on at least one surface. In this case, the first optical film is able to be used as an antistatic film or an electrode film of a touch panel. For example, conductive layers disclosed in JP2013-1009A, JP2012-216550A, JP2012-151095A, JP2012-25158A, JP2011-253546A, JP2011-197754A, JP2011-34806A, JP2010-198799A, JP2009-277466A, JP2012-216550A, JP2012-151095A, the pamphlet of WO2010/140275A, and the pamphlet of WO02010/114056A are able to be exemplified as the conductive layer.

—Hardcoat Layer—

The first optical film may include a hardcoat layer on at least one surface. In this case, it is possible to improve scratch resistance of the first optical film. In addition, the first optical film including the hardcoat layer is able to be used as a support of an anti-reflection film. In a case of an image display device having high definition and high quality, such as a liquid crystal display device (LCD) or an organic EL display device, it is preferable that an anti-reflection film is used in order to prevent a decrease in contrast due to reflection of external light on a display surface or reflected glare of an image in addition to dust-proof properties described above.

A composition and a formation method of the hardcoat layer can be referred to the description disclosed in JP2000-111706A, and the contents of the publication are incorporated in the present invention.

(Manufacturing Method of First Optical Film)

The first optical film is able to be formed by using any one method of known film formation methods such as a solution film formation method and a melting film formation method. In order to set the retardation of the first optical film in the in-plane direction and in the thickness direction to be in the range defined in the present invention, it is preferable that a stretching step is provided. Hereinafter, a film formation method of the first optical film will be described in detail.

—Melting Film Formation Method—

(1) Melting

It is preferable that the negative birefringence resin is mixed and pelletized before melting film formation. According to the pelletization, surging in a hopper of a melting extruder is suppressed, and thus, stable supply is able to be performed. In a preferred size of the pellet, a sectional area is 1 mm$^2$ to 300 mm$^2$, and a length is 1 mm to 30 mm.

The pellet of the resin is put into the melting extruder, and is dehydrated at 100° C. to 200° C. for 1 minute to 10 hours, and then, is kneaded and extruded. The kneading is able to be performed by using a monoaxial or biaxial extruder.

In general, an uniaxial extruder having comparatively low equipment costs is frequently used as the type of extruder, examples of the uniaxial extruder include a screw type extruder such as a full-flight extruder, a Maddox extruder, and a Dulmage extruder, and the full-flight type extruder is preferable. In addition, a biaxial extruder is able to be used in which a vent port is disposed in the middle of the extruder by changing a screw segment, and thus, the extrusion is able to be performed while devolatilizing, unnecessary volatile components. The biaxial extruder is broadly classified into a same-direction type biaxial extruder and a different-direction type biaxial extruder, either of them is able to be used, and a same-direction rotation type biaxial extruder is preferable in which a residual portion is rarely generated and self-cleaning performance is high. The biaxial extruder has high kneading properties and high supply performance of the resin, and thus, extrusion at a low temperature is able to be performed, and the biaxial extruder is suitable for the film formation of the present invention.

(2) Filtration

In order to filter foreign substances in the resin or to avoid damage of a gear pump due to the foreign substances, so-called breaker plate type filtration is preferably performed in which a filter material is disposed in an outlet of the extruder. In addition, in order to filter the foreign substances with high accuracy, it is preferable that a filtration device in which a so-called leaf type disk filter is incorporated is provided after passing through the gear pump. The filtration is able to be performed by disposing a filtration portion in one place, or multi-stage filtration may be performed in a plurality of places. It is preferable that filtration accuracy of the filter material is high, and the filtration accuracy is preferably 15 μm to 3 μm, and is more preferably 10 μm to 3 μm, from the viewpoint of pressure resistance of the filter material or an increase in a filtration pressure due to clogging of the filter material. In particular, when the leaf type disk filter device is used in which foreign substance filtration is performed finally, it is preferable that a filter material having high filtration accuracy is used from the viewpoint of quality, and the filter material is able to be adjusted according to the number of loadings in order to ensure pressure resistance and suitability of filter life. It is preferable that a steel material is used as the type of filter material from the viewpoint of using the filter material at high temperature and high pressure, and among the steel materials, stainless steel, steel, and the like are particularly preferably used, and the stainless steel is particularly preferably used from the viewpoint of corrosion. For example, a sintered filter material formed by sintering a metal long fiber or a metal powder is able to be used as the configuration of the filter material in addition to a filter material in which a wire material is woven, and the sintered filter material is preferable from the viewpoint of filtration accuracy and filter life.

(3) Gear Pump

In order to improve thickness accuracy, it is important that a variation in a discharge amount is reduced, and it is preferable that a constant amount of resin is supplied from the gear pump by disposing the gear pump between the extruder and a dice. The gear pump is contained in a state where a pair of gears formed of a drive gear and a driven gear are engaged to each other, and in the gear pump, both gears are engagedly rotated by driving the drive gear, a melted resin is suctioned into a cavity from a suction port formed in a housing, and similarly, a constant amount of the resin is discharged from a discharge port formed in the housing. Even when the pressure of the resin in a tip portion of the extruder slightly varies, the variation is absorbed by using the gear pump, a variation in the pressure of the resin on a downstream of a film forming device is extremely reduced, and thus, thickness variation is reduced. A variation width in the pressure of the resin in a die portion is able to be in a range of ±1% by using the gear pump.

In order to improve constant amount supply performance by using the gear pump, a method is able to be used in which the number of rotations of the screw is changed, and thus, the pressure before the gear pump is controlled such that the pressure is constant. In addition, a gear pump with high accuracy using three or more gears is effective in which a variation in the gear of the gear pump is eliminated.

(4) Die

The resin is melted by the extruder configured as described above, and the melted resin is continuously transported to a die through the filtration machine and the gear pump, as necessary. Any type of die such as a T die, a fishtail die, and a hanger coat die which are generally used is able to be used as the die insofar as the die is designed such that the residual melted resin in the dice is reduced. In addition, a static mixer may be immediately before the die in order to increase uniformity of the temperature of the resin. The clearance of a die outlet portion may be generally 1.0 time to 5.0 times the film thickness, is preferably 1.2 times to 3 times the film thickness, and more preferably 1.3 times to 2 times the film thickness. When the lip clearance is greater than or equal to 1.0 time the film thickness, an excellent surface-like sheet is easily obtained by the film formation, and thus, setting the lip clearance to be greater than or equal to 1.0 time the film thickness is preferable. In addition, when the lip clearance is less than or equal to 5.0 times the film thickness, thickness accuracy of the sheet easily increases, and thus, setting the lip clearance to be less than or equal to 5.0 times the film thickness is preferable. The die is an extremely important facility which determines the thickness accuracy of the film, and a die is preferable in which thickness adjustment is able to be exactly controlled. In addition, a design is important in which temperature unevenness or flow rate unevenness in a width direction of the die is reduced to the maximum extent.

(5) Cast

In the method described above, it is preferable that the melted resin which is extruded into the shape of a sheet by the die is cooled and solidified on a casting drum, and thus, an unstretched film is obtained. At this time, methods such as a static electricity applying method, an air knife method, an air chamber method, a vacuum nozzle method, and a touch roll method are used, and it is preferable that adhesiveness between a casting drum and the melted and extruded sheet increases. Such an adhesiveness improving method may be performed with respect to the entire surface of the melted and extruded sheet, or may be performed with respect to a part of the surface of the melted and extruded sheet. In particular, a method of adhering only both end portions of the film, which is referred to as edge pinning, is generally used, but the method is not limited thereto.

It is more preferable that the melted resin is gradually cooled by using a plurality of cooling rolls, and in particular, the casting drum may be comparatively excellently three cooling rolls in general, but the number of cooling rolls is not limited. The diameter of the roll is preferably 50 mm to 5,000 mm, and an interval between a plurality of rolls is preferably 0.3 mm to 300 mm between the surfaces.

The temperature of casting drum is preferably Tg the negative birefringence resin −70° C. to Tg+20° C., is more preferably Tg−50° C. to Tg+10° C., and is even more preferably Tg−30° C. to Tg+5° C.

In addition, when a so-called touch roll method is used, the surface of a touch roll may be a resin such as rubber or Teflon (registered trademark), or may be a metal roll. Further, the thickness of the metal roll is thinned, and thus, the surface of the roll is slightly recessed due to a pressure at the time of being touched, a crimping area is widened, and a roll which is referred to as a flexible roll is able to be used.

The temperature of the touch roll is preferably Tg−70° C. to Tg+20° C., is more preferably Tg−50° C. to Tg+10° C., and is even more preferably Tg−30° C. to Tg+5° C.

(6) Stretching

As described above, it is preferable that a cast film which is extruded onto the cast drum (an unstretched raw material) is stretched such that the optical properties that the first optical film used in the image display device of the present invention satisfies are exhibited. In this case, it is preferable that the cast film is stretched in at least a monoaxial direction of a vertical (MD) direction or a horizontal (TD) direction, and may be biaxially stretched in the vertical (MD) direction and the horizontal (TD) direction. In a case where the cast film is biaxially stretched in the vertical direction and the horizontal direction, the stretching may be performed according to a sequence of the vertical direction→the horizontal direction and a sequence of the horizontal direction→the vertical direction, or may be concurrently performed in two directions. Further, for example, it is preferable that the stretching is performed in a multi-stage such as the vertical direction→the vertical direction→the horizontal direction, the vertical direction→the horizontal direction→the vertical direction, and the vertical direction→the horizontal direction→the horizontal direction.

In addition, the stretching may be performed in an oblique direction such that the slow axis of the first optical film is at an angle of 45° with respect to the vertical direction. In this case, it is preferable that the polarizing plate is manufactured by bonding the first optical film to the polarizer in a roll-to-roll process since the angle $\theta_1$ between the slow axis of the first optical film and the absorption axis of the polarizer becomes 45°±30°.

The vertical stretching is able to be attained by disposing two or more nip rolls in general, and by setting the peripheral speed of the nip roll on an outlet side to be higher than that of the nip roll on an inlet side while allowing a heated raw material to pass through the two or more nip rolls. At this time, as described above, it is preferable that a temperature difference occurs between the front side and the back side.

In addition, it is preferable that the raw material is preheated before the vertical stretching. The preheating temperature is preferably Tg of the negative birefringence resin −50° C. to Tg+30° C., is more preferably Tg−40° C. to Tg+15° C., and is even more preferably Tg−30° C. to Tg. Such preheating may be performed by being in contact with a heating roll, may be performed by using a radiation heat source (an IR heater, a halogen heater, and the like), or may be performed by blowing off hot air.

It is preferable that the vertical stretching is performed at Tg−10° C. to Tg+50° C., is more preferably performed at Tg to Tg+40° C., and is even more preferably performed at Tg to Tg+30° C. The stretching ratio is preferably 1.1 times to 5.5 times, and is more preferably 1.3 times to 3 times. Furthermore, here, the stretching ratio is a value obtained by the following expression.

Stretching Ratio=(Length after Being Stretched Length before Being Stretched)/(Length before Being Stretched)

After the vertical stretching, the cooling is preferably performed at Tg−50° C. to Tg, is more preferably performed at Tg−45° C. to Tg−5° C., and is even more preferably performed at Tg−40° C. to Tg−10° C. Such cooling may be performed by being in contact with a cooling roll, or may be performed by blowing off cool air.

It is preferable that the horizontal stretching is performed by using a tenter. That is, the horizontal stretching is able to be performed by widening a clip in a width direction while gripping both ends of the film with the clip and transporting the film to a heat treatment zone.

A preferred stretching temperature is Tg−10° C. to Tg+50° C., is more preferably Tg to Tg+40° C., and is even more preferably Tg to Tg+30° C. The stretching ratio is preferably 1.1 times to 5.5 times, and is more preferably 1.3 times to 3 times.

In the stretching step, it is preferable that a heat treatment is performed with respect to the film after the stretching treatment.

The heat treatment is performed with respect to the film at approximately Tg+10° C. to Tg+50° C. (more preferably, Tg+15° C. to Tg+30° C.) for 1 second to 60 seconds (more preferably, 2 seconds to 30 seconds). It is preferable that thermal fixing is continuously performed after the horizontal stretching in a state of being gripped by a chuck in the tenter, and at this time, a chuck interval may be a width at the time of ending the horizontal stretching, may be wider than the width, or may be narrower than the width. According to the heat treatment, it is possible to adjust Re and Rth to be in the range of the present invention.

(7) Winding

It is preferable that both ends of the sheet obtained in this way are trimmed and wound. The trimmed portion may be subjected to a pulverization treatment or may be subjected to a pelletization treatment or a treatment such as depolymerization and repolymerization as necessary, and then may be reused as a raw material for the same type of film or a raw material for the different type of film. Any type of cutter such as a rotary cutter, a shearing blade, and a knife may be used as a trimming cutter. Either carbon steel or stainless steel may be used as the material. In general, it is preferable that a cemented carbide blade and a ceramic blade are used from the viewpoint of elongating the life of the cutter and of suppressing the occurrence of a chip.

In addition, it is preferable that a laminated film is attached to at least one surface before the winding from the viewpoint of preventing a defect. A preferred winding tension is 1 kg/m width to 50 kg/width, is more preferably 2 kg/m width to 40 kg/width, and is even more preferably 3 kg/m width to 20 kg/width. When the winding tension is greater than or equal to 1 kg/m width, it is preferable that the film is easily homogeneously wound. In addition, when the winding tension is less than or equal to 50 kg/width, the film is not strongly wound, but winding appearance is excellent, and a bump portion of the film does not extend due to a creep phenomenon and thus, does not cause waving of the film, or residual birefringence due to the stretching of the film does not occur. The winding tension is detected by tension controlling in the middle of a line, and it is preferable that the winding is performed while being controlled such that the winding tension is constant. When there is a difference in the temperature of the film, the length of the film may be slightly different according to the place of the film forming line due to thermal expansion, and thus, it is necessary that tension of greater than or equal to the definition is not applied to the film in the middle of the line by adjusting a draw ratio between the nip rolls.

The winding is able to be performed at a constant tension by controlling the winding tension, and it is preferable that suitable winding tension is set by performing tapering according to a winding diameter. In general, the tension gradually decreases as the winding diameter becomes larger, and according to a case, it may be preferable that the tension increases as the winding diameter becomes larger. Such a winding method is able to be similarly applied to the following solution film formation method.

—Solution Film Formation Method—

(1) Film Formation

When the first optical film is formed by using a solution film formation method, first, the negative birefringence resin is dissolved in a solvent. When the resin is dissolved in the solvent, the total concentration of the resin is preferably 3 mass % to 50 mass %, is more preferably 5 mass % to 40 mass %, and is even more preferably 10 mass % to 35 mass %. The viscosity of the obtained solution at a room temperature is generally 1 (mPa·s) to 1,000,000 (mPa·s), is preferably 10 (mPa·s) to 100,000 (mPa·s), is more preferably 100 (mPa·s) to 50,000 (mPa·s), and is particularly preferably 1,000 (mPa·s) to 40,000 (mPa·s).

Examples of the solvent to be used are able to include an aromatic solvent such as benzene, toluene, and xylene, a cellosolve-based solvent such as methyl cellosolve, ethyl cellosolve, and 1-methoxy-2-propanol, a ketone-based solvent such as dacetone alcohol, acetone, cyclohexanone, methyl ethyl ketone, 4-methyl-2-pentanone, ethyl cyclohexanone, and 1,2-dimethyl cyclohexane, an ester-based solvent such as methyl lactate and ethyl lactate, a halogen-containing solvent such as 2,2,3,3-tetrafluoro-1-propanol, methylene chloride, and chloroform, an ether-based solvent such as tetrahydrofuran and dioxane, and an alcohol-based solvent such as 1-pentanol and 1-butanol.

In addition, in addition to the above description, it is preferable that a solvent is used in which an SP value (a parameter for the degree of solubility) is usually in a range of 10 (MPa$^{1/2}$) to 30 (MPa$^{1/2}$). The solvent described above is able to be independently used or two or more types thereof are able to be used in combination. In a case where two or more types of the solvents are used in combination, it is preferable that the range of the SP value as a mixture is in the range described above. At this time, the SP value as the mixture is able to be obtained from the mass ratio thereof, and for example, in a case where two or more types of mixtures are used, the mass fraction of the respective solvents are set to W1 and W2, and the SP values are set to SP1 and SP2, the SP value of the mixed solvent is able to be obtained as a value calculated by the following expression.

SP Value=$W1$−SP1+$W2$−SP2

Further, in order to improve surface smoothness of the first optical film, a leveling agent may be added. Any general leveling agent is able to be used, and for example, a fluorine-based nonionic surfactant, a special acrylic resin-based leveling agent, a silicone-based leveling agent, and the like are able to be used as the leveling agent.

In general, examples of a method of manufacturing the first optical film by using the solution film formation method include a method in which the solution described above is applied onto a substrate such as a metal drum, a steel belt, a polyester film of polyethylene terephthalate (PET), polyethylene naphthalate (PEN), or the like, and a polytetrafluoroethylene belt by using a dice or a coater, and then, the solvent is dried and removed, and the film is peeled off from the substrate.

In addition, a resin solution is applied onto the substrate by using means such as a spray, a brush, roll spin coating, and clipping, and then the solvent is dried and removed, the film is peeled off from the substrate, and thus, the optical film is able to be manufactured. Furthermore, the thickness, the surface smoothness, and the like may be controlled by repeating the coating.

In addition, when the polyester film is used as the substrate, a film which is subjected to a surface treatment may be used. Examples of a method of the surface treatment include a hydrophilization treatment method which is generally performed, for example, a method of laminating an acrylic resin or a sulfonate group-containing resin by coating or laminating, a method of improving hydrophilicity of the film surface by a corona discharge treatment and the like, or the like.

(2) Drying

A drying (solvent removing) step of the solution film formation method described above is not particularly limited, but is able to be performed by using a method which is generally used, for example, a method of allowing the solvent to pass a drying furnace through a plurality of rollers, and in a case where air bubbles are generated according to evaporation of the solvent in the drying step, properties of the film remarkably decrease, and thus, in order to avoid this, it is preferable that the drying step is a plurality of steps of two or more steps, and the temperature or the air volume in each of the steps is controlled.

In addition, the amount of residual solvent in the first optical film is generally less than or equal to 10 mass %. Thus, it is preferable that the amount of residual solvent decreases since a sticking mark trouble by decreasing the amount of residual solvent is able to be further reduced.

(3) Stretching

As described above, the first optical film which is obtained by using the solution film formation method is able to be stretched by the same method as the stretching method at the time of performing melting film formation.

<Polarizer>

The image display device of the present invention includes the polarizer described above, and the first optical film described above is arranged on the visible side from the polarizer.

The image display device may include one polarizer, or may have two or more polarizers. For example, in a case where the image display device is a liquid crystal display device, it is preferable that the image display device includes one polarizer on at least the visible side from a liquid crystal cell, and it is more preferable that the image display device includes one polarizer on each of a visible side and a light source side of the liquid crystal cell. For example, in a case where the image display device is an organic EL display device, it is preferable that the image display device includes one polarizer on at least the visible side from a light emitting layer. A preferred configuration of the image display device will be described below.

It is preferable that the polarizer includes the polarizer protective film on both sides. In the present invention, an embodiment is preferable in which the first optical film described above is laminated on one polarizer protective film on the visible side of the polarizer on the visible side, and is integrated therewith. Furthermore, at least one of the polarizer protective film may be the first optical film described above.

Any one of an iodine-based polarizer, a dye-based polarizer using a dichromatic dye, and a polyene-based polarizer may be used as the polarizer. In general, it is preferable that the iodine-based polarizer and the dye-based polarizer is stretched and manufactured by using a polyvinyl alcohol-based film. It is general that the absorption axis of the polarizer corresponds to the stretching direction of the film. Accordingly, it is preferable that a polarizer stretched in the vertical direction (a transport direction and a film longitudinal direction) has an absorption axis which is parallel to a longitudinal direction, and a polarizer stretched in the horizontal direction (a direction vertical to the transport direction) has an absorption axis which is vertical to the longitudinal direction.

<Second Film>

Further, it is preferable that the image display device of the present invention further comprises a second film including a film which is stretched in at least a monoaxial direction, and the second film is arranged on the visible side from the first optical film.

The film stretched in at least a monoaxial direction is able to be confirmed, according to the anisotropy of the refractive index of the film.

An angle $\theta_2$ between the slow axis of the first optical film and a slow axis of the second film is not particularly limited. In particular, in image display device of the related art, in a case where the angle $\theta_2$ between the slow axis of the first optical film and the slow axis of the second film is 90°, cancelling of the retardation of the first optical film on appearance and the retardation of the second film on appearance becomes most remarkable, and the rainbow unevenness becomes easily visible, but in the image display device of the present invention, even in a case where $\theta_2$ is 90°, the rainbow unevenness is rarely visible.

In the image display device of the present invention, it is preferable that the second film includes a biaxially stretched film. The second film may be a single layer of the biaxially stretched film, or may be a laminated body of the biaxially stretched film and other layers.

It is more preferable that the second film is used for applications of fingerprint adhesion prevention or glass scattering prevention as a surface protective film configured of a biaxially stretched film having great optical anisotropy, such as a biaxially stretched polyester film.

It is more preferable that the second film is a film which has great optical anisotropy and is stretched in at least a monoaxial direction as a substrate of a touch panel substrate.

In the image display device of the present invention, it is preferable that the second film includes a conductive layer on at least one surface, and in this case, a preferred embodiment of the conductive layer is identical to a preferred embodiment of the conductive layer in a case where the first film includes the conductive layer.

In addition, in this case, in the image display device of the present invention, it is preferable that the touch panel substrate described below includes the second film.

In the image display device of the present invention, the thickness of second film is preferably 10 μm to 500 μm, is more preferably 15 μm to 300 μm, and is particularly preferably 20 μm to 200 μm.

Retardation Re(589) of the second film in the in-plane direction at a wavelength of 589 nm is preferably 100 nm to 30,000 nm, is more preferably 100 nm to 10,000 nm, and is even more preferably 100 nm to 3,000 nm.

In the image display device of the present invention, it is preferable that retardation Rth(589) of the second film in the thickness direction at a wavelength of 589 nm satisfies 0 nm≤Rth(589), and the retardation Rth(589) of the second film is more preferably 100 nm to 30,000 nm, and is particularly preferably 100 nm to 20,000 nm. When Rth (589) of the second film is in such a positive range, rainbow unevenness of the image display device in which the second film is arranged on the visible side is easily suppressed by the first optical film having negative Rth(589).

<Configuration of Image Display Device>

The image display device of the present invention is a liquid crystal display device including a blue light emitting diode or an ultraviolet light emitting diode, a fluorescent body enabling light to be emitted by being excited by light from the blue light emitting diode or the ultraviolet light emitting diode, and a liquid crystal cell, or an organic EL display device. It is preferable that the liquid crystal display device described above is a liquid crystal display device which includes a white LED including a blue light emitting diode or an ultraviolet light emitting diode, and a fluorescent body enabling at least yellow light to be emitted by being excited by light from the blue light emitting diode or the ultraviolet light emitting diode as a light source, or a liquid crystal display device which includes the blue light emitting diode or the ultraviolet light emitting diode as a light source, and the fluorescent body arranged between the light source and the liquid crystal cell.

The liquid crystal display device is able to be used for a mobile phone, a smart phone, a portable information terminal, a car navigation, a tablet PC, a selling device, ATM, factory automation (FA) device, and the like without any limitation. In particular, the image display device of the present invention is able to be suitably used for a television, a monitor, a mobile phone, a smart phone, a portable information terminal, a car navigation, a tablet PC, a selling device, ATM, an FA device, a digital camera, an electronic game machine, and all other image display devices including a touch panel in which there is a possibility that a surface protective film is bonded by an end user.

In addition, the image display device of the present invention may be an image display device using the first optical film described above instead of the film which is used in the related art as the substrate of the touch panel substrate.

It is preferable that the image display device of the present invention includes cover glass or the touch panel substrate on the visible side from the first optical film, and it is more preferable that the image display device of the present invention includes the cover glass and the touch panel substrate on the visible side from the first optical film.

It is particularly preferable that the image display device of the present invention includes the cover glass and the touch panel substrate, and the cover glass, the second film, and the first optical film are arranged in this order from the visible side. In this case, in the image display device of the present invention, it is preferable that the touch panel substrate includes the second film.

On the other hand, it is also preferable that the image display device of the present invention includes the second film on the visible side from the cover glass.

FIG. 1 illustrates a liquid crystal display device 101 embodying the invention. The device 101 includes a cover glass or touch panel substrate 102, a second optical film 103, a conductive layer 104, a hardcoat layer 105, a first optical film 106, a polarizer 107, a liquid crystal cell 108 and a backlight 109. Also shown are a blue light LED 110 and a fluorescent body 111.

Figure 2:
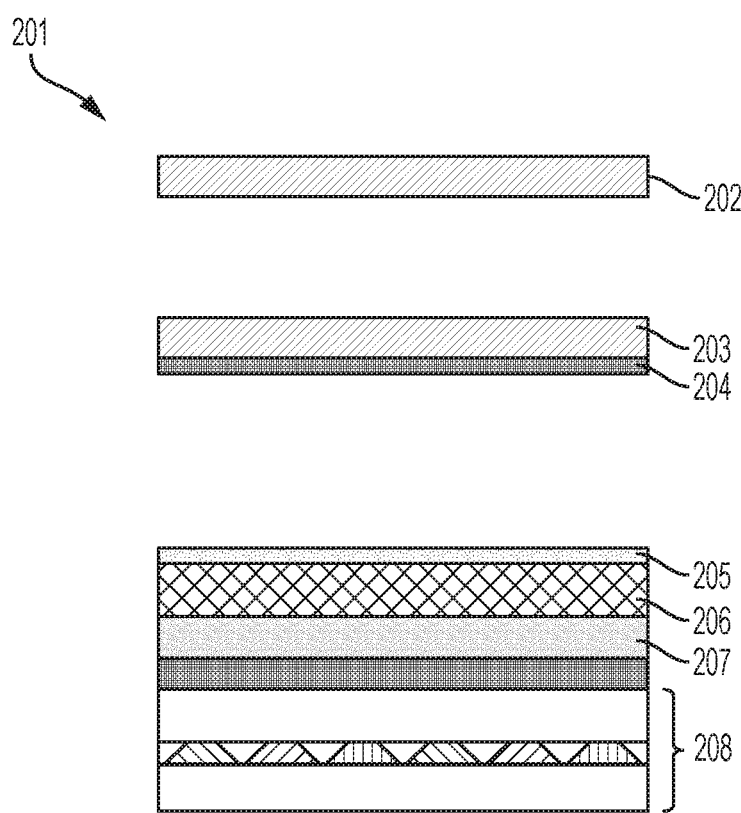
FIG. 2 is an illustration of an organic EL display device embodying the invention.

FIG. 2 illustrates an organic EL display device 201 embodying the invention. The device 201 includes a cover glass or touch panel substrate 202, a second optical film 203, a conductive layer 204, a hardcoat layer 205, a first optical film 206, a polarizer 207 and an organic EL panel 208.

Hereinafter, a specific configuration of a preferred embodiment of the image display device of the present invention will be described.

Examples of the configuration of the image display device are able to include:

(A0) An embodiment in which the liquid crystal panel including the liquid crystal cell and the polarizer includes the first optical film, and neither the touch panel substrate nor the cover glass is included;

(A1) An embodiment in which the liquid crystal panel including the liquid crystal cell and the polarizer includes the first optical film, the touch panel substrate is disposed on the visible side from the liquid crystal panel, and the cover glass is disposed on the visible side;

(A2) An embodiment in which the liquid crystal panel including the liquid crystal cell and the polarizer and the touch panel substrate are integrated with each other, the touch panel substrate includes the first optical film, and the cover glass is disposed on the visible side;

(A3) An embodiment in which the liquid crystal panel including the liquid crystal cell and the polarizer is included, the liquid crystal panel includes the first optical film, and a cover glass member in which the cover glass and the touch panel substrate are integrated with each other is disposed on the visible side;

(A4) An embodiment in which the liquid crystal panel including the liquid crystal cell and the polarizer is included, the cover glass member in which the cover glass and the touch panel substrate are integrated with each other is disposed on the visible side, and the touch panel substrate includes the first optical film;

(B0) An embodiment in which an organic EL panel including a light emitting layer is included, a circularly polarizing plate is disposed on the visible side from the organic EL panel, the circularly polarizing plate includes the first optical film, and neither the touch panel substrate nor the cover glass is included;

(B1) An embodiment in which the organic EL panel including the light emitting layer is included, the circularly polarizing plate is disposed on the visible side from the organic EL panel, the circularly polarizing plate includes the first optical film, the touch panel substrate is disposed on the visible side from the circularly polarizing plate, and the cover glass is disposed on the visible side;

(B2) An embodiment in which the organic EL panel including the light emitting layer, the circularly polarizing plate, and the touch panel substrate are integrated with each other, either the circularly polarizing plate or the touch panel substrate includes the first optical film, and the cover glass is disposed on the visible side;

(B3) An embodiment in which the organic EL panel including the light emitting layer is included, the circularly polarizing plate is disposed on the visible side from the organic EL panel, the circularly polarizing plate includes the first optical film, the cover glass member in which the cover glass and the touch panel substrate are integrated with each other is disposed on the visible side from the circularly polarizing plate;

(B4) An embodiment in which the organic EL panel including the light emitting layer is included, the circularly polarizing plate is disposed on the visible side from the organic EL panel, the cover glass member in which the cover glass and the touch panel substrate are integrated with each other is disposed on the visible side from the circularly polarizing plate, and the cover glass member includes the first optical film; and the like.

Examples of the image display device of the embodiment of (A0) are able to include an embodiment in which the first optical film described above is used as a visible side polarizer protective film or a part of the visible side polarizer protective film of a polarizing plate on the visible side, in a known liquid crystal television.

Examples of the image display device of the embodiment of (A3) are able to include an embodiment in which the first optical film described above is used as the visible side polarizer protective film or a part of the visible side polarizer protective film of the polarizing plate on the visible side, in a tablet terminal "iPad (herein, iPad is a registered trademark)-mini" manufactured by Apple Inc.

Examples of the image display device of the embodiment of (A4) are able to include an embodiment in which the first optical film described above is used as the substrate of the touch panel substrate of the cover glass member, in a tablet terminal "iPad-mini" manufactured by Apple Inc.

Examples of the image display device of the embodiment of (B0) are able to include an embodiment in which the first optical film described above is used by being arranged on a visible side polarizer protective Elm of a linear polarizer which is used as a part of the circularly polarizing plate, a part of the visible side polarizer protective film, a part of the touch panel substrate which is arranged on the visible side from the circularly polarizing plate, or a part of the cover glass which is arranged on the visible side from the circularly polarizing plate, in a known organic EL television.

Examples of the image display device of the embodiment of (B2) are able to include an embodiment in which the first optical film described above is used by being arranged on the visible side polarizer protective film of the linear polarizer which is used as a part of the circularly polarizing plate, a part of the visible side polarizer protective film, and a part of the touch panel substrate which is arranged on the visible side from the circularly polarizing plate, in a smart phone "GALAXY S4" manufactured by Samsung Electronics Co., Ltd.

(Liquid Crystal Display Device)

In a case where the image display device of the present invention is a liquid crystal display device, the driving mode of the liquid crystal cell may be a VA mode, an IPS mode, a TN mode, an ECB mode, or any other mode.

In a liquid crystal cell in a VA mode, rod-like liquid crystalline molecules are substantially vertically aligned at the time of not applying a voltage. The liquid crystal cell in the VA mode includes (1) a liquid crystal cell in a VA mode in the narrow sense in which rod-like liquid crystalline molecules are substantially vertically aligned at the time of not applying a voltage and are substantially horizontally aligned at the time of applying a voltage (disclosed in JP1990-176625A (JP-H02-176625A)), (2) a liquid crystal cell (in an MVA mode) in which a multidomain of a VA mode is obtained in order to widen a view angle (disclosed in SID97, Digest of Tech. Papers (Proceedings) 28 (1997) 845), (3) a liquid crystal cell in a mode (in an n-ASM mode) in which rod-like liquid crystalline molecules are substantially vertically aligned at the time of not applying a voltage and are twistedly aligned in multidomain at the time of applying a voltage (disclosed in Proceedings 58 and 59 of Japan Liquid Crystal Conference (1998)), and (4) a liquid crystal cell in a SURVAIVAL Mode (published in LCD International 98).

The liquid crystal cell in the IPS mode is a liquid crystal cell in a mode in which switching is performed by applying a horizontal electric field to a nematic liquid crystal, and specifically, is disclosed in Proc. IDRC (Asia Display '95), p. 577 to 580 and p. 707 to 710.

In the liquid crystal cell in the TN mode, it is preferable that the rod-like liquid crystalline molecules are substantially horizontally aligned at the time of not applying a voltage, and are twistedly aligned by 60° to 120°. The liquid crystal cell in the TN mode is most commonly used as a color TFT liquid crystal display device, and is disclosed in a plurality of literatures.

In the liquid crystal cell in the ECB mode, rod-like liquid crystalline molecules are substantially horizontally aligned at the time of not applying a voltage. The ECB mode is one of the modes of the liquid crystal display, which has the simplest structure, and for example, the details are disclosed in JP1993-203946A (JP-H05-203946A).

It is preferable that the liquid, crystal display device includes a blue light emitting diode or an ultraviolet light emitting diode, and a fluorescent body as a light source. In this case, it is preferable that the fluorescent body to be used emits fluorescent light of a blue color, a red color, a green color, a yellow color, or the like, and it is more preferable that the fluorescent body emits fluorescent light of a yellow color. In this case, it is preferable since a light emitting spectrum becomes continuous over a visible range, and the occurrence of the rainbow unevenness is able to be suppressed in a case where light is transmitted through a film having high retardation.

In addition, the fluorescent body may be included in the light source of the light emitting diode, that is, in the light emitting unit, or may be included between the light source and the liquid crystal cell (that is, between the light emitting diode and the liquid crystal panel), for example, in a diffusion sheet or the like.

Further, the fluorescent body may be a quantum dot, and a combination of a quantum dot which is exited by light from the blue light, emitting diode or the ultraviolet light emitting diode and emits green light and a quantum dot which is excited by light from the blue light emitting diode or the ultraviolet light emitting diode and emits red light is more preferable.

(Organic EL Display Device)

The image display device of the present invention may be an organic EL display device. The organic EL display device is a display device in which a light emitting layer or a plurality of organic compound thin films including the light emitting layer is formed between a pair of electrodes of a positive electrode and a negative electrode, a hole injection layer, a hole transport layer, an electron injection layer, an electron transport layer, protective layer, and the like may be included in addition to the light emitting layer, and each of the layers may have different functions. Each of the layers is able to be formed by using various materials.

The organic EL display device may include a light emitting layer emitting light of each color of a red color, a green color, and a blue color, and may include a light emitting layer emitting light of white color and a color filter.

The organic EL display device which is used in the present invention includes a polarizer.

The polarizer may be used as any member of the organic EL display device, and in general, the polarizer is used as a part of the circularly polarizing plate.

It is preferable that the organic EL display device includes the circularly polarizing plate on the visible side. It is preferable that the circularly polarizing plate is a polarizing plate including a λ/4 wavelength plate and a polarizer, and the polarizer is arranged on the visible side from the λ/4 wavelength plate. In the present invention, the first optical film is further arranged on the visible side of the polarizer. The organic EL display device including the circularly polarizing plate is preferable since reflection of external light is able to be suppressed and excellent visibility is able to be obtained.

EXAMPLES

Hereinafter, the characteristics of the present invention will be more specifically described with reference to examples and comparative examples. Materials, used amounts, ratios, treatment contents, treatment sequences, and the like of the following examples are able to be suitably changed unless the changes cause deviance from the gist of the present invention. Therefore, the range of the present invention will not be restrictively interpreted by the following specific examples.

Manufacturing Example: Preparation of First Optical Film

<Syndiotactic Polystyrene>

0.3 mass % of a hindered phenol-based stabilizer "Irganox1010" (manufactured by BASF SE) and 0.7 mass % of an ultraviolet absorbent 2,2'-(p-phenylene)di-3,1-benzaxazine-4-one (manufactured by FUJIFILM Finechemicals Co., Ltd., Product Name: UVSORB 101) were mixed into a commercially available syndiotactic polystyrene resin XAREC S105 (manufactured by Idemitsu Kosan Co., Ltd.), were melted and extruded at 300° C. by using an uniaxial extruder having a diameter ϕ of 30 mm, and adhered to a cooling roll at 50° C. by using an electrostatic pinning method, and thus, an unstretched film was formed. At this time, a screen filter, a gear pump, and a leaf type disk filter were sequentially arranged between an extruder and a die, were connected to each other through a melt pipe, and were extruded from a die having a width of 450 mm and a lip gap of 1 mm.

Next, the unstretched film was stretched in a horizontal direction at a temperature of 115° C. and a stretching ratio of 3.8 times, and was subjected to a heat treatment for 10 seconds while being relaxed by 5% in a width direction at a temperature of 200° C., and thus, a stretched film having a thickness of 100 μm was prepared, and a stretched film B1 was obtained.

(Formation of Hardcoat Layer)

A mixed coating liquid (Acryl-1) having the following compositions was directly applied onto one surface of the stretched film B1 without disposing an easily adhesive layer, was dried such that the dried film became 5 μm, and was cured by being irradiated with an ultraviolet ray, and thus, a hardcoat layer was formed.

(Composition of Acryl-1)

Pentaerythritol Hexaacrylate 85 parts by mass

2-Hydroxy-3-Phenoxy Propyl Acrylate 15 parts by mass

Photopolymerization Initiator (Product Name: IRGACURE 184, manufactured by BASF SE) 5 parts by mass Methyl Ethyl Ketone 200 parts by mass Thus, a first optical film to be used in Example 1 was obtained.

First optical films to be used in Examples 2 to 5, 12, and 13 and Comparative Example 2 in which the thickness and the stretching ratio of the unstretched film were suitably changed, and the thickness of the first optical film excluding the hardcoat layer was changed as shown in Table 1 described below were obtained by the same method.

<Atactic Polystyrene>

First optical films to be used in Examples 6 to 8, 10, and 11 and Comparative Example 3 in which the thickness of the first optical film excluding the hardcoat layer was changed as shown in Table 1 described below were obtained by the same method as that in Example 1 except that the material was changed to a commercially available atactic polystyrene resin HF77 (manufactured by PS Japan Corporation), and the thickness and the stretching ratio of the unstretched film were suitably changed.

<Modified Acryl>

A first optical film to be used in Example 9 in which the thickness of the first optical film excluding the hardcoat layer was changed as shown in Table 1 described below was obtained by the same method as that in Example 1 except that the material was changed to a commercially available modified acrylic resin DELPET 980N (manufactured by Asahi Kasei Corporation), and the thickness of the unstretched film was changed.

<PET>

A first optical film to be used in Comparative Example 1 in which the thickness was changed as shown in Table 1 described below was manufactured according to a method disclosed in the examples of JP2011-215646A. Furthermore, the hardcoat layer was not disposed in the first optical film to be used in Comparative Example 1.

[Evaluation of First Optical Film]

(Measurement of Re and Rth)

A film thickness d of the manufactured first optical film was measured by using an electronic micrometer "K—402B" manufactured by ANRITSU CORPORATION.

Next, the refractive index, nx, ny, and nz of the first optical film were measured by using "ABBE'S REFRACTOMETER NAR-4T" manufactured by Atago Co., Ltd. and a sodium lamp.

The film thickness and the refractive index obtained as described above were substituted into Expressions (1) and (2) described below, and thus, in-plane retardation. Re of the first optical film and retardation Rth of the first optical film in a film thickness direction were obtained.

$$Re = (nx \times d) \times d \quad (1)$$

$$Rth\{(nx+ny)/2-nz\} \times d \quad (2)$$

The resin the film thickness, and the values of Re and Rth of the first optical film to be used in each of the examples and the comparative examples were shown in Table 1 described below.

Examples 1 to 9 and Comparative Examples 1 to 3

The first optical film which was obtained as described above and was used in each of the examples and the comparative examples, the first optical film was bonded onto the surface of a polarizer protective film which became the most visible side of a liquid crystal television "24B5" manufactured by TOSHIBA CORPORATION through SK2057 manufactured by Soken Chemical & Engineering Co., Ltd. which is a pressure sensitive adhesive material such that the hardcoat layer became the visible side, and thus, an image display device was manufactured. At this time, the bonding was performed such that an angle $θ_1$ between a absorption axis of a polarizer used on the visible side of "24B5" and a slow axis of the first optical film became an angle shown in Table 1 described below. Thus, image display devices of Examples 1 to 9 and Comparative Examples 1 to 3 of the embodiment of (A0) were obtained.

Example 10

Cover glass of a smart phone "GALAXY S4" manufactured by Samsung. Electronics Co., Ltd. which is an organic EL display device was detached, the first optical film to be used in Example 10 was bonded onto the surface of a touch panel substrate which became the most visible side of a laminated body in which an organic EL panel, a circularly polarizing plate, and a touch panel substrate were integrated with each other through SK2057 manufactured by Soken Chemical & Engineering Co., Ltd. which is a pressure sensitive adhesive material such that the hardcoat layer became the visible side, and thus, an image display device was manufactured. At this time, the bonding was performed such that an angle $\theta_1$ between an absorption axis of a linear polarizer used as a part of the circularly polarizing plate on the visible side of "GALAXY S4" and a slow axis of the first optical film became an angle shown in Table 1 described below. After that, the detached cover glass was attached to the smart phone. Thus, an image display device of Example 10 of the embodiment of (B2) was obtained.

Furthermore, in the laminated body of "GALAXY S4" in which the organic EL panel and the touch panel substrate were integrated with each other, a film satisfying the optical properties of the first optical film of the present invention was not arranged.

Example 11

An image display device of Example 11 of the embodiment of (A0) was obtained by the same method as that in Examples 1 to 9 except that a blue LED was included as a light source instead of the liquid crystal television "24B5" manufactured by TOSHIBA CORPORATION, and a liquid crystal television "KDL-46W900A" manufactured by Sony Corporation which included a fluorescent body between the light source and the liquid crystal cell was used.

Example 12

A cover glass member of a tablet terminal "iPad-mini" manufactured by Apple Inc. was detached, the first optical film manufactured in Example 12 was bonded onto the surface of a polarizer protective film which became the most visible side of a liquid crystal panel through SK2057 manufactured by Soken Chemical & Engineering Co., Ltd. which is a pressure sensitive adhesive material such that the hardcoat layer became the visible side, and thus, an image display device was manufactured. At this time, the bonding was performed such that an angle $\theta_1$ between an absorption axis of a polarizer used on the visible side of "iPad-mini" and a slow axis of the first optical film became an angle shown in Table 1. Further, the cover glass member was attached to the liquid crystal panel again, and thus, an image display device of Example 12 of the embodiment of (A3) was obtained.

Furthermore, the liquid crystal panel of "iPad-mini" was in an IPS liquid crystal mode, and the cover glass member was integration of cover glass and a touch panel substrate. Specifically, in the cover glass member, a cyclic olefin-based resin film having high Re was included as a substrate, and a touch panel substrate including an ITO transparent conductive layer and cover glass to be arranged on the visible side from the touch panel substrate were disposed.

The cyclic olefin-based resin film having high Re was a monoaxial stretched fain and corresponded to the second film. In addition, the cyclic olefin-based resin film having high Re had a thickness of 100 μm, Re of 140 nm, and performance as a λ/4 plate.

Example 13

A cover glass member of a tablet terminal "iPad-mini" manufactured by Apple Inc. was detached, as with Example 12. After that, a cyclic olefin-based resin film which was used as a substrate of a touch panel substrate of the cover glass member and included an ITO transparent conductive layer was peeled off from cover glass, and instead, the ITO transparent conductive layer was formed on both surfaces of the first optical film manufactured in Example 12 by vapor deposition and was bonded to the cover glass through a pressure sensitive adhesive material, and a cover glass member was assembled. The obtained cover glass member was attached to a liquid crystal panel, and thus, an image display device was manufactured. At this time, the bonding was performed such that an angle $\theta_1$ between an absorption axis of a polarizer used on the visible side of "iPad-mini" and a slow axis of the first optical film became an angle shown in Table 1. Thus, an image display device of Example 13 of the embodiment of (A4) was obtained.

[Evaluation]

<Evaluation of Visibility (Not Bonded with Biaxially Stretched PET)>

The manufactured image display device of each of the examples and the comparative examples was observed from a front surface and an oblique direction by mounting polarized sunglasses. At this time, in a linear polarizer of the used polarized sunglasses, an azimuth of an absorption axis was parallel to the ground. In addition, in an observation azimuth, an angle with respect to the absorption axis of the polarizer was observed at every angle of 10° from 0° to 180°, and a polar angle was observed at every angle of 10° from the front surface to a polar angle of 80°, and thus, a brightness change in a screen display and the occurrence of rainbow unevenness were evaluated.

Brightness was evaluated on the basis of the following criteria. Evaluation of A or B is practically necessary, and evaluation of A is more preferable.

A . . . The display does not darken and the display contents are visible at all of the azimuths, the polar angles, and the oblique angles of the face of an observer who wears polarized sunglasses.

B . . . The display may darken, but the display contents are visible.

C . . . The display may darken to the extent that the display contents are not visible.

In addition, the rainbow unevenness was evaluated on the basis of the following criteria. Evaluation of A or B is practically necessary, and evaluation of A is more preferable.

A . . . The rainbow unevenness is not visible at all of the azimuths, the polar angles, and the oblique angles of the face of the observer who wears the polarized sunglasses.

B . . . Extremely weak rainbow unevenness may be visible.

C . . . The rainbow unevenness is strongly visible.

The evaluation results are shown in Table 1 described below.

<Bonded with Biaxially Stretched PET>

Evaluation of simulating a case where a fingerprint adhesion prevention film or a glass scattering prevention film, or an electrode film of a touch panel was disposed on the more visible side from the first optical film of the manufactured image display device of each of the examples and the comparative examples was performed by the following method.

Specifically, a biaxially stretched PET film (thickness of 100 μm, Re of approximately 1,500 nm, and Rth of approximately 16,000 μm) was arranged on the surface of the image display device of each of the examples and the comparative examples on the more visible side from the first optical film as the second film such that an angle $\theta_2$ between a slow axis of the biaxially stretched PET film which is the second film and a slow axis of the first optical film became 0°, 45°, 90°, or 135° in the arrangement of each $\theta_2$, observation was performed from the front surface and the oblique direction by mounting polarized sunglasses.

Furthermore, in Example 12, the touch panel substrate including the second film having high Re therein was mounted on the visible side from the first optical film, and thus, the evaluation of further arranging the biaxially stretched PET film was not performed.

In a linear polarizer of the used polarized sunglasses, an azimuth of an absorption axis was parallel to the ground. In addition, in an observation azimuth, an angle with respect to the absorption axis of the polarizer was observed at every angle of 10° from 0° to 180°, and a polar angle was observed at every angle of 10° from the front surface to a polar angle of 80°, and thus, a brightness change in a screen display and the occurrence of rainbow unevenness were evaluated.

Brightness was evaluated on the basis of the following criteria. Evaluation of A or B is practically necessary, and evaluation of A is more preferable.

A . . . The display does not darken and the display contents are visible at all of the azimuths, the polar angles, and the oblique angles of the face of the observer who wears the polarized sunglasses.

B . . . The display may darken, but the display contents are visible.

C . . . The display may darken to the extent that the display contents are not visible.

In addition, the rainbow unevenness was evaluated on the basis of the following criteria. Evaluation of A or B is practically necessary, and evaluation of A is more preferable.

A . . . The display does not darken and the display contents are visible at all of the azimuths, the polar angles, and the oblique angles of the face of the observer who wears the polarized sunglasses.

B . . . Extremely weak rainbow unevenness may be visible.

C . . . The rainbow unevenness is strongly visible.

The evaluation results are shown in Table 1 described below.

In Table 1 described below, the results with respect to a case of $\theta_2$ of 90° where cancelling of the retardation of the first optical film and the retardation of the second film (the biaxially stretched PET film) becomes most remarkable, and the visibility of the rainbow unevenness becomes high are shown.

TABLE 1

| | Image Display Device | | First Optical Film | | | | Angle $\theta_1$ between Slow Axis of First Optical Film and Absorption Axis of Polarizer | Visibility (Not Bonded with Biaxially Stretched PET) | | Visibility (Bonded with Biaxially Stretched PET, $\theta_2 = 90°$) | |
|---|---|---|---|---|---|---|---|---|---|---|---|
| | Mode | Type of Light Source | Resin | Film Thickness (Excluding Hardcoat Layer) | Re | Rth | | Brightness | Occurrence of Rainbow Unevenness | Brightness | Occurrence of Rainbow Unevenness |
| | — | — | — | μm | nm | nm Unit | Degree | — | — | — | — |
| Example 1 | VA Liquid Crystal | White LED | SPS | 100 | 8,000 | −9,000 | 45 | A | A | A | A |
| Example 2 | VA Liquid Crystal | White LED | SPS | 45 | 4,200 | −4,800 | 45 | A | B | B | B |
| Example 3 | VA Liquid Crystal | White LED | SPS | 75 | 6,000 | −7,000 | 45 | A | B | A | B |
| Example 4 | VA liquid Crystal | White LED | SPS | 200 | 16,000 | −17,000 | 45 | A | A | A | A |
| Example 5 | VA Liquid Crystal | White LED | SPS | 300 | 24,000 | −25,000 | 45 | A | A | A | A |
| Example 6 | VA Liquid Crystal | White LED | PS | 300 | 8,000 | −9,000 | 45 | A | A | A | A |
| Example 7 | VA Liquid Crystal | White LED | PS | 300 | 8,000 | −9,000 | 15 | B | A | B | A |
| Example 8 | VA Liquid Crystal | White LED | PS | 300 | 8,000 | −9,000 | 75 | B | A | B | A |
| Example 9 | VA Liquid Crystal | White LED | MS | 300 | 6,000 | −3,000 | 45 | A | A | A | B |
| Example 10 | Organic EL | Independently Emitting Light of RGB | PS | 300 | 8,000 | −9,000 | 45 | A | A | A | A |
| Example 11 | VA Liquid Crystal | Blue LED + Fluorescent Body | PS | 300 | 8,000 | −9,000 | 45 | A | A | A | A |
| Example 12 | IPS Liquid Crystal | White LED | SPS | 100 | 8,000 | −9,000 | 45 | A | A | — | — |
| Example 13 | IPS Liquid Crystal | White LED | SPS | 100 | 8,000 | −9,000 | 45 | A | A | A | A |

TABLE 1-continued

| | Image Display Device | | First Optical Film | | | | Angle θ₁ between Slow Axis of First Optical Film and Absorption Axis of Polarizer | Visibility (Not Bonded with Biaxially Stretched PET) | | Visibility (Bonded with Biaxially Stretched PET, θ₂ = 90°) | |
|---|---|---|---|---|---|---|---|---|---|---|---|
| | Mode | Type of Light Source | Resin | Film Thickness (Excluding Hardcoat Layer) | Re | Rth Unit | | Brightness | Occurrence of Rainbow Unevenness | Brightness | Occurrence of Rainbow Unevenness |
| | — | — | — | μm | nm | nm | Degree | — | — | — | — |
| Comparative Example 1 | VA Liquid Crystal | White LED | PET | 100 | 8,000 | 9,000 | 45 | A | C | A | C |
| Comparative Example 2 | VA Liquid Crystal | White LED | SPS | 15 | 2,000 | −2,300 | 45 | B | C | B | C |
| Comparative Example 3 | VA Liuid Crystal | White LED | PS | 300 | 8,000 | −9,000 | 0 | C | A | C | A |

From Table 1 described above, it has been found that in the image display device of the present invention, the occurrence of the rainbow unevenness is able to be suppressed without darkening the brightness at the time of being observed by mounting the polarized sunglasses, and even in a case where the film which has great optical anisotropy and is stretched in at least a monoaxial direction is further disposed on the visible side of the image display device, the occurrence of the rainbow unevenness is able to be suppressed without darkening the brightness at the time of being observed by mounting the polarized sunglasses.

In contrast, it has been found that in the image display device of Comparative Example 1 using the optical film having Rth which is positive and is greater than the upper limit value of the present invention, the rainbow unevenness occurs at the time of being observed by mounting the polarized sunglasses, and in a case where a surface protective film configured of the film which has great optical anisotropy and is stretched in at least a monoaxial direction is further bonded on the visible side of the image display device of Comparative Example 1, the rainbow unevenness occurs at the time of being observed by mounting the polarized sunglasses.

It has been found that in the image display device of Comparative Example 2 using the optical film having Re which is greater than the upper limit value of the present invention and Rth which is greater than the upper limit value of the present invention, the rainbow unevenness occurs at the time of being observed by mounting the polarized sunglasses, and in a case where a surface protective film configured of the film which has great optical anisotropy and is stretched in at least a monoaxial direction is further bonded on the visible side of the image display device of Comparative Example 2, the rainbow unevenness occurs at the time of being observed by mounting the polarized sunglasses.

It has been found that in the image display device of Comparative Example 3 using the optical film in which the angle θ₁ between the absorption axis of the polarizer to be used on the visible side and the slow axis of the first optical film is lower than the lower limit value of the present invention, the rainbow unevenness occurs at the time of being observed by mounting the polarized sunglasses, and in a case where a surface protective film configured of the film which has great optical anisotropy and is stretched in at least a monoaxial direction is further bonded on the visible side of the image display device of Comparative Example 3, the rainbow unevenness occurs at the time of being observed by mounting the polarized sunglasses.

Furthermore, the evaluation of a case where the angle $\theta_2$ between the slow axis of the biaxially stretched PET film which is the second film and the slow axis of the first optical film is 0°, 45°, and 135° has the same trend as that of the evaluation of a case where the angle $\theta_2$ between the slow axis of the biaxially stretched PET film which is the second film and the slow axis of the first optical film is 90°.

<Evaluation in Naked Eyes>

In addition, observation was performed in naked eyes without mounting the polarized sunglasses by the same method as that of the evaluation of the image display device of the present invention. Even in this case, it has been confirmed that the rainbow unevenness does not occur without darkening the brightness, and excellent visibility is obtained.

INDUSTRIAL APPLICABILITY

According to the present invention, it is possible to provide an image display device in which bright and excellent visibility is able to be obtained even in a case of observing a screen by mounting polarized sunglasses, and the occurrence of the rainbow unevenness is suppressed, even in a case of bonding a surface protective film configured of a film which has great optical anisotropy, such as a biaxially stretched polyester film or a case of using a touch panel in which the film having great optical anisotropy is used as a substrate of an electrode film in order to prevent fingerprint adhesion, glass scattering, or the like. For this reason, the image display device of the present invention is able to be suitably used for a television, a monitor, a smart phone, a car navigation, a digital camera, an electronic game machine, and all other image display devices including a touch panel in which there is a possibility that a surface protective film is bonded by a user. In addition, the first optical film included in the image display device of the present invention is also able to have a function as an anti-reflection film, a glass scattering prevention film, and an electrode film of a touch panel, and thus, industrial applicability is high.

What is claimed is:

1. An image display device, comprising at least:
    a polarizer; and
    a first optical film,
    wherein the first optical film is arranged on a visible side from the polarizer,
    in-plane retardation Re(589) of the first optical film at a wavelength of 589 nm satisfies 3,000 nm≤Re(589)≤30,000 nm,
    retardation Rth(589) of the first optical film in a thickness direction at a wavelength of 589 nm satisfies −30,000 nm≤Rth(589)≤−3,000 nm,
    an angle $\theta_1$ between a slow axis of the first optical film and an absorption axis of the polarizer is $\theta_1$=45°±30°, and
    the image display device is a liquid crystal display device including a blue light emitting diode or an ultraviolet light emitting diode, a fluorescent body enabling light to be emitted by being excited by light from the blue light emitting diode or the ultraviolet light emitting diode, and a liquid crystal cell, or an organic EL display device.

2. The image display device according to claim 1,
    wherein the liquid crystal display device is a liquid crystal display device which includes a white LED including a blue light emitting diode or an ultraviolet light emitting diode, and a fluorescent body enabling at least yellow light to be emitted by being excited by light from the blue light emitting diode or the ultraviolet light emitting diode as a light source, or a liquid crystal display device which includes the blue light emitting diode or the ultraviolet light emitting diode as a light source, and the fluorescent body arranged between the light source and the liquid crystal cell.

3. The image display device according to claim 1, further comprising:
    a second film including a film which is stretched in at least a monoaxial direction,
    wherein the second film is arranged on the visible side from the first optical film.

4. The image display device according to claim 3,
    wherein the second film includes a biaxially stretched film.

5. The image display device according to claim 3,
    wherein the second film includes a conductive layer on at least one surface.

6. The image display device according to claim 3,
    wherein a thickness of the second film is 10 μm to 500 μm.

7. The image display device according to claim 3,
    wherein retardation Rth(589) of the second film in the thickness direction at a wavelength of 589 nm satisfies 0 nm≤Rth(589).

8. The image display device according to claim 1, further comprising:
    cover glass or a touch panel substrate on the visible side from the first optical film.

9. The image display device according to claim 8,
    wherein the touch panel substrate includes a second film.

10. The image display device according to claim 9,
    wherein the image display device includes the cover glass and the touch panel substrate, and
    the cover glass, the second film, and the first optical film are arranged in this order from the visible side.

11. The image display device according to claim 1,
    wherein the first optical film includes a hardcoat layer.

12. The image display device according to claim 1,
    wherein the first optical film contains an ultraviolet absorbent.

13. The image display device according to claim 1,
    wherein the first optical film includes a conductive layer on at least one surface.

14. The image display device according to claim 1,
    wherein a thickness of the first optical film is 10 μm to 500 μm.

15. The image display device according to claim 1,
    wherein the first optical film contains a polystyrene-based resin.

16. The image display device according to claim 15,
    wherein the polystyrene-based resin includes a crystalline polystyrene-based resin.

17. The image display device according to claim 15,
    wherein the polystyrene-based resin has a syndiotactic structure.

* * * * *